United States Patent
Moore

(10) Patent No.: US 11,038,513 B1
(45) Date of Patent: Jun. 15, 2021

(54) PHASE-LOCKED LOOP WITH REDUCED FREQUENCY TRANSIENTS

(71) Applicant: Raytheon Company, Waltham, MA (US)

(72) Inventor: Gary I. Moore, Tewksbury, MA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 16/832,538

(22) Filed: Mar. 27, 2020

(51) Int. Cl.
    *H03L 7/093* (2006.01)
    *H03B 5/18* (2006.01)
    *H03L 7/107* (2006.01)

(52) U.S. Cl.
    CPC .......... *H03L 7/093* (2013.01); *H03B 5/1817* (2013.01); *H03L 7/1075* (2013.01)

(58) Field of Classification Search
    CPC ........ H03L 7/093; H03L 7/107; H03L 7/1075
    See application file for complete search history.

(56) References Cited

U.S. PATENT DOCUMENTS

| | | | |
|---|---|---|---|
| 4,980,652 A | 12/1990 | Tarusawa | |
| 6,404,292 B1* | 6/2002 | Lautzenhiser | H03L 7/099 331/17 |
| 7,659,782 B2* | 2/2010 | Cong | H03L 7/093 331/16 |
| 8,076,979 B2* | 12/2011 | Kathuria | H03L 7/095 331/1 R |
| 10,693,474 B1* | 6/2020 | Efthivoulidis | H03L 7/093 |
| 10,715,151 B2* | 7/2020 | Jin | H03K 5/24 |
| 2007/0159262 A1 | 7/2007 | Quan et al. | |
| 2008/0129402 A1 | 6/2008 | Song-Rong et al. | |

FOREIGN PATENT DOCUMENTS

| | | |
|---|---|---|
| EP | 360442 A | 3/1990 |
| WO | 2013/060608 | 5/2013 |
| WO | 2014/012179 | 1/2014 |

OTHER PUBLICATIONS

International Search Report and Written Opinion dated Apr. 12, 2021 in corresponding International Application No. PCT/US2021/012429.

* cited by examiner

*Primary Examiner* — Ryan Johnson
(74) *Attorney, Agent, or Firm* — Renner, Otto, Boisselle & Sklar, LLP

(57) ABSTRACT

A phased locked loop (PLL) having a filter output voltage that is limited to a fraction of the voltage range accepted by the tuning port of a voltage-controlled oscillator (VCO) under control and a control system responsive to the filter output voltage and for summing the filter output voltage with an elevator voltage and applying the summed voltage to the VCO tuning port.

20 Claims, 2 Drawing Sheets

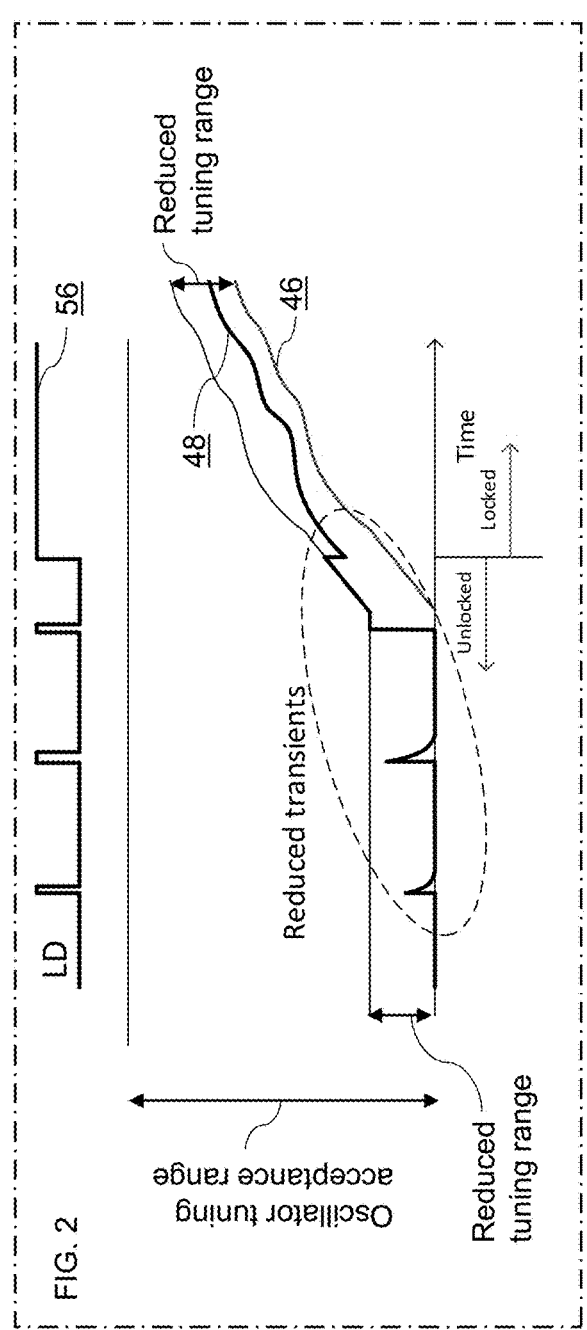
FIG. 2
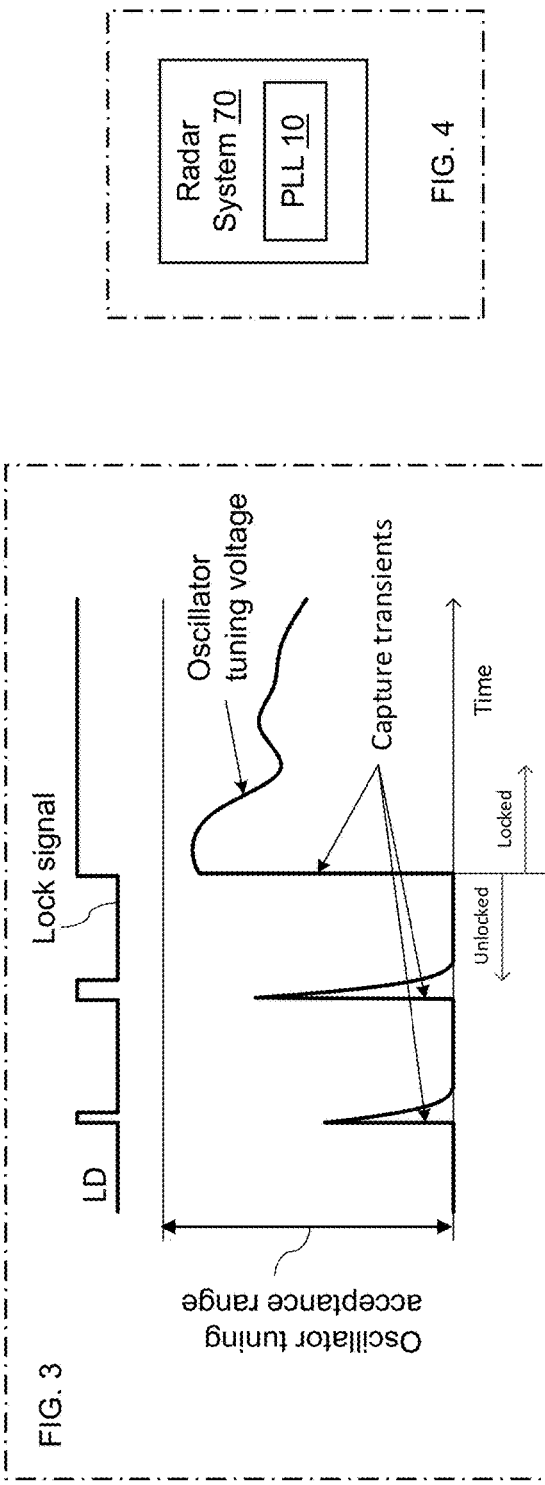
FIG. 3
FIG. 4

PHASE-LOCKED LOOP WITH REDUCED FREQUENCY TRANSIENTS

TECHNICAL FIELD

The present disclosure relates generally to phase-locked loops and more specifically to phase-locked loops having reduced frequency transients.

BACKGROUND

A phase-locked loop (PLL) is a control system used to generate an output signal having a phase related to the phase of an input reference signal. That is, PLLs are circuits used to generate an output signal synchronized (also referred to as locked) to an input reference signal.

Typically, a PLL is an electronic circuit including a variable frequency oscillator, a phase detector and a filter arranged in a feedback loop. The oscillator (also referred to as a voltage-controlled oscillator (VCO)) generates a periodic signal (the output signal) that is compared by the phase detector to the input reference signal. Often, one or both of the input reference signal and the output signal, may pass through frequency dividers before being applied to the phase detector. The output of the phase detector is filtered to produce a tuning voltage which is applied to control the frequency of the oscillator. The feedback loop is arranged to maintain the output of the phase detector at a desired fixed, or controlled, value. The PLL is said to be locked when the output of the phase detector is maintained within some predetermined range of the desired value, the frequency of the oscillator is also maintained at a target value as a consequence.

Generally a critical parameter of a PLL is the bandwidth of the filter, which controls the dynamic performance of the PLL once locked. However, the combination of filter and phase detector characteristics, controls how the PLL transitions from an unlocked, to a locked condition. This transition, also known as capture, is often of importance to systems utilizing the output signal.

SUMMARY

All other considerations aside, a PLL can only capture and maintain phase lock if the target frequency lies within the tuning range of the oscillator. In some temperature-controlled oscillators, for example sapphire-resonator oscillators or oven-controlled crystal oscillators, the oscillator frequency varies, particularly during startup, with the temperature of the resonator or crystal. In such examples, the oscillator frequency may lie outside the capture range of the PLL until such time as the resonator reaches its nominal operating temperature. Also in such examples, the behavior of the PLL as the frequency approaches the capture range is therefore of importance.

In a Type 2 PLL, the phase detector is a phase-frequency detector (PFD), which has the advantage of providing a nearly constant output indicative of the frequency error when the oscillator frequency is outside the capture range. The output of the PFD controls a charge pump which can drive rapidly the filter output voltage over its full range when the oscillator frequency comes within the capture range. Thus, in a Type 2 PLL, utilizing a PFD, the filter bandwidth usually does not limit the speed with which the PLL can transition from unlocked to locked, and the capture range is maximized. Also, to take advantage of this characteristic, the filter output voltage range is matched to a maximally useful portion of the oscillator tuning range.

The rapid response and maximal capture range of a Type 2 PLL, independent of filter bandwidth, are significant advantages when considering the application of PLLs to temperature-controlled oscillators. But, this rapid response can also be a disadvantage if down-stream systems cannot track the near-instantaneous change in oscillator frequency that occurs at the time of phase locking. For example, amplitude-and-phase noise-degeneration circuitry, used in sapphire oscillators, can be driven into saturation by such transients, disrupting proper sapphire oscillator function.

The PLL described herein reduces the magnitude of near-instantaneous frequency transients that occur during phase locking of an oscillator. This PLL has particular application in relation to sapphire oscillators, where transients can cause malfunction of the noise-degeneration circuitry.

The PLL described herein reduces significantly the PLL filter output voltage swing relative to the tuning voltage range accepted by the oscillator, thereby limiting the magnitude of any frequency transients compared to a PLL designed along normal principles. However, this has a penalty not only in the form of reduced PLL capture range but also reduced ability of the PLL to maintain phase lock in the face of external disturbances, for example external temperature fluctuations in the case of temperature-controlled oscillators. To overcome this, a second voltage (also referred to as an elevator voltage) is added to the reduced PLL filter output to generate a combined voltage that accesses the full tuning range of the oscillator of the PLL. The elevator voltage is adjusted by a control system responsive to the PLL filter voltage, the control system being such that the elevator voltage has a limited slew rate. The PLL filter voltage rides the elevator voltage up and down to access the full VCO tuning range, thereby restoring the effective capture range and ability to maintain phase lock while the limited slew rate of the elevator voltage ensures no additional locking transients are introduced.

The present disclosure provides a PLL having (1) a filter output voltage that is limited to a fraction of the voltage range accepted by the tuning port of a VCO under control and (2) a control system responsive to the filter output voltage and generating the elevator voltage and (3) means for combining the filter output voltage with the elevator voltage and applying the combined voltage to the VCO tuning port.

According to one aspect of the disclosure, there is provided a phased locked loop (PLL) having reduced frequency transients. The PLL includes a phase-frequency detector (PFD), a charge pump, a filter, an oscillator, a reducer circuit, and a control circuit. The PFD is configured to output a PFD signal based on two inputs. The two inputs include a reference signal and a feedback signal. The charge pump is configured to receive the PFD signal and output a charge signal. The filter is configured to receive the charge signal and output a filter output signal. The oscillator is configured to receive an oscillator tuning signal within a tuning acceptance range and output an oscillating signal. The reducer circuit is configured to receive the filter output signal and output a reduced tuning signal. The control circuit is configured to receive a control input signal based on the filter output signal. The control circuit determines and outputs an elevator signal based on the control input signal and the tuning acceptance range of the oscillator. The oscillator tuning signal is based on a combination of the reduced tuning signal and the elevator signal. The oscillating signal has a frequency and a phase based at least in part on the oscillator tuning signal. The feedback signal is received by the PFD is based on the oscillating signal.

Alternatively or additionally, the control circuit input signal is the reduced tuning signal.

Alternatively or additionally, the PLL also includes a frequency divider configured to receive the oscillating signal and output the feedback signal having a feedback frequency comprising a fraction of the oscillating signal frequency.

Alternatively or additionally, the oscillator tuning signal is the sum of the reduced tuning signal and the elevator signal.

Alternatively or additionally, the oscillator tuning signal has a range comprised of a substantial portion of the tuning acceptance range.

Alternatively or additionally, the oscillator tuning signal has a range comprised of at least 90% of the tuning acceptance range.

Alternatively or additionally, the elevator signal has an elevator slew rate comprising a time derivate of the elevator signal. The elevator slew rate is limited by the control circuitry to be less than a maximum slew rate calculated from properties of the charge pump and the filter.

Alternatively or additionally, the elevator slew rate is less than 10% of the maximum slew rate.

Alternatively or additionally, the reduced tuning signal has a reduced tuning range comprised of only a portion of the tuning acceptance range of the oscillator.

Alternatively or additionally, the reducer circuit is adjustable such that the reduced tuning range comprises a selectable portion of the acceptance range.

Alternatively or additionally, the reduced tuning range is less than 30% of the tuning acceptance range.

Alternatively or additionally, the PLL additionally includes a lock detector configured to output a lock signal based on a phase of the reference signal and a phase of the feedback signal.

Alternatively or additionally, when a phase difference between the phase of the oscillator signal and the phase of the reference signal is less than a lock threshold, the lock signal indicates that lock has been achieved. Also, when the phase difference is greater than the lock threshold, the lock signal indicates that lock has not been achieved.

Alternatively or additionally, the control circuit is configured to additionally receive the lock signal. The elevator voltage is determined based on the control input signal, the tuning acceptance range of the oscillator, and the lock signal.

Alternatively or additionally, when the lock signal indicates that lock has not been achieved, an amplitude of the elevator voltage is adjusted by the control circuit such that an amplitude of the oscillator tuning signal is maintained in relation to a particular extreme of the tuning acceptance range of the oscillator. Also, the particular extreme of the tuning acceptance range comprises a minimum or a maximum of the tuning acceptance range and the particular extreme of the tuning acceptance range is chosen based on an amplitude of the control input signal.

Alternatively or additionally, a difference, maintained between the oscillator tuning signal and the particular extreme, has a magnitude not greater than the reduced tuning range.

Alternatively or additionally, when the lock signal indicates that lock has been achieved, an amplitude of the elevator signal is continuously adjusted to maintain the control input signal relative to a midpoint of the control input signal.

Alternatively or additionally, the control input signal is maintained between 10% and 90% of its range.

Alternatively or additionally, the control input signal and oscillator tuning signal are both analog signals. Also, the control circuit includes: an analog-to-digital converter (ADC) configured to convert the control input signal to a digital signal and a digital-to-analog converter (DAC) configured to convert the elevator signal to an analog signal.

Alternatively or additionally, the oscillator includes a sapphire-loaded cavity resonator.

According to another aspect of the disclosure, there is provided a radar system. The radar signals are derived at least in part from the oscillating signal of the PLL.

While a number of features are described herein with respect to embodiments of the invention; features described with respect to a given embodiment also may be employed in connection with other embodiments. The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

FIG. 2 depicts exemplary capture transients for different lock states of the PLL of FIG. 1.

FIG. 3 depicts exemplary capture transients for different lock states of a standard PLL.

FIG. 4 shows a block diagram of a radar system including the PLL of FIG. 1.

DETAILED DESCRIPTION

Figure 1:
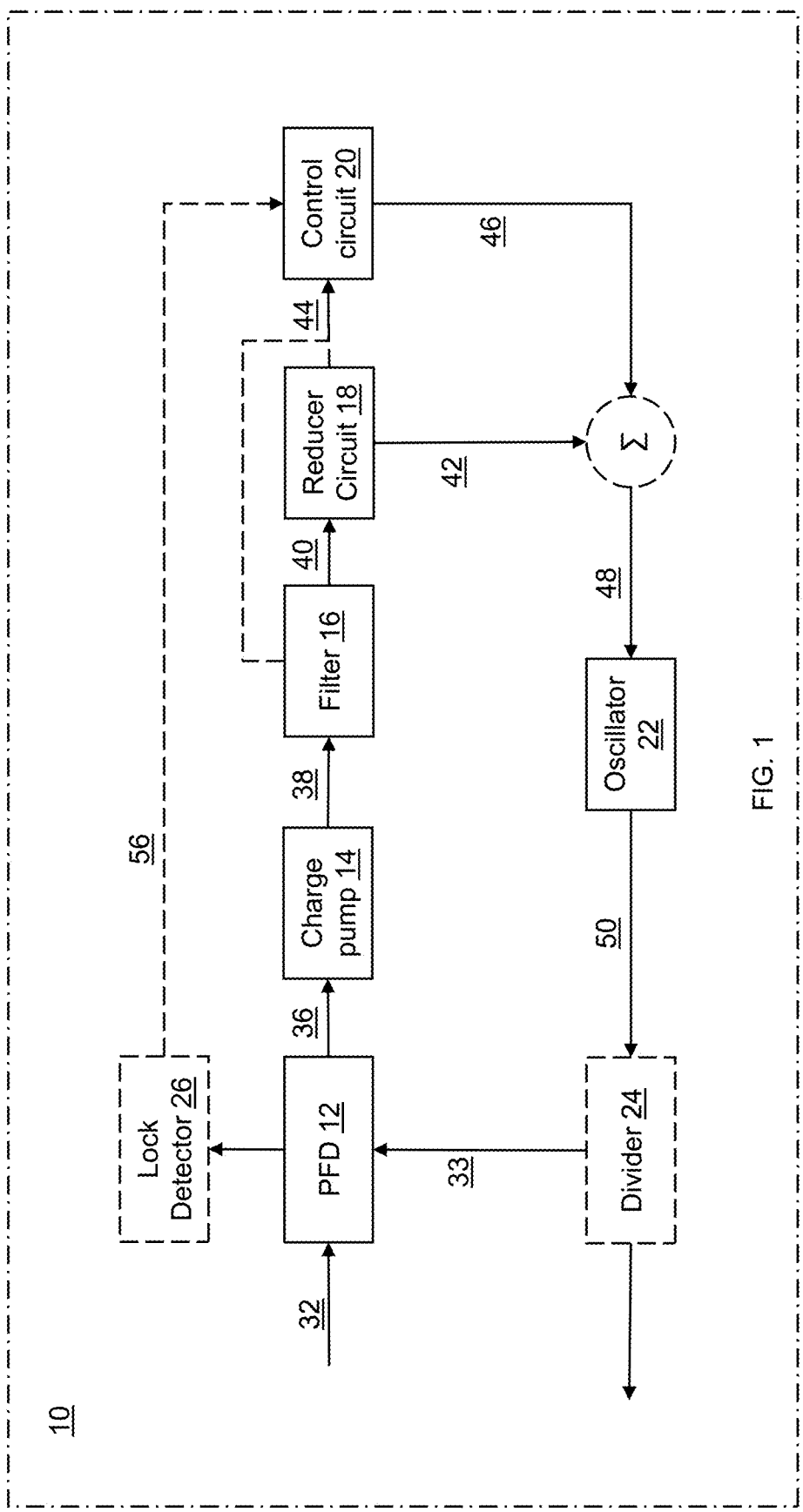
FIG. 1 shows a shows a block diagram of an embodiment of a phased locked loop (PLL) having reduced frequency transients.

The present invention is now described in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

The present invention provides a phased locked loop (PLL) including a phase-frequency detector (PFD), charge pump, filter, oscillator, and control circuit. The control circuit is configured to generate an elevator signal based on the signal output by the filter and the tuning acceptance range of the oscillator.

Turning to FIG. 1, an embodiment of a PLL 10 having reduced frequency transients is shown. The PLL 10 includes a phase-frequency detector (PFD) 12, a charge pump 14, a filter 16, a reducer circuit 18, a control circuit 20, and an oscillator 22.

The PFD 12 is configured to output a PFD signal 36 based on two inputs. The two inputs include a reference signal 32 and a feedback signal 33. For example, the PFD 12 may compare two or more input signals and produce an error signal (e.g., the PFD signal) that is proportional to a phase difference between the two inputs.

The charge pump 14 is configured to receive the PFD signal 36 and output a current signal 38.

The filter 16 is configured to receive the current signal 38 and output a filter output signal 40. The filter 16 may be a low pass frequency filter.

The reducer circuit 18 is configured to receive the filter output signal 40 and output a reduced tuning signal 42. The reduced tuning signal 42 has a reduced tuning range of only a portion of the tuning acceptance range of the oscillator 22. The reducer circuit 18 may be adjustable such that the reduced tuning range is a selectable portion of the acceptance range. For example, the reduced tuning range may be less than 40%, less than 30%, or less than 20% of the tuning acceptance range. As is described in further detail below, the reduced tuning signal 42 is combined with an elevator signal 46 output by the control circuit 20 before being received by the oscillator 22.

The control circuit 20 is configured to receive as an input a control input signal 44. The control input signal 44 is a signal based on the filter output signal 40. For example, the control input signal 44 may be the reduced tuning signal 42. The control circuit 20 determines and outputs an elevator signal 46 based on the control input signal 44 and the tuning acceptance range of the oscillator 22. As described above, the elevator signal 46 is combined with the reduced tuning signal 42 before reaching the oscillator 22. Because the reduced tuning signal 42 has a range (e.g., ±2 volts (V)) that is only a portion of the tuning acceptance range of the oscillator 22 (e.g., ±10 V), the elevator signal 46 is used to modify the reduced tuning signal 42 to use more of the tuning acceptance range of the oscillator 22.

The elevator signal 46 may have a time derivate referred to as an elevator slew rate. The elevator slew rate may be limited by the control circuitry 20 to be less than a maximum slew rate calculated from properties of the charge pump 14 and the filter 16. For example, the elevator slew rate may be less than 10% of the maximum slew rate or less than some other limit as applicable to the particular application.

The oscillator 22 is configured to receive an oscillator tuning signal 48 that is within a predetermined tuning acceptance range of the oscillator 22. The acceptance range of the oscillator 22 may be a voltage range acceptable by the oscillator 22 wherein the relationship between frequency and tuning voltage is approximately linear.

The oscillator tuning signal 48 is based on a combination of the reduced tuning signal 42 and the elevator signal 46. For example, the oscillator tuning signal 48 may be a sum of the reduced tuning signal 42 and the elevator signal 46. The oscillator tuning signal 48 may have a range that is a substantial portion of the tuning acceptance range (e.g., ±9V of a tuning range of ±10V). For example, the oscillator tuning signal 48 may have a range that is at least 90%, at least 80%, or at least 70% of the tuning acceptance range of the oscillator 22.

The oscillator 22 outputs an oscillating signal 50. The oscillating signal 50 has a frequency and a phase based at least in part on the oscillator tuning signal 48. For example, the oscillating signal 50 may have a frequency and a phase that is based on the oscillator tuning signal 48 as well as some other parameter such as ambient temperature.

The oscillator 22 may be any suitable oscillator, such as a voltage-controlled oscillator (VCO). In a preferred embodiment, the oscillator 22 includes a sapphire-loaded cavity resonator.

The feedback signal 33 received by the PFD 12 is based on the oscillating signal 50. In this way, the feedback signal 33 may be used as part of a negative feedback loop. For example, the PLL 10 may include a frequency divider 24 configured to receive the oscillating signal 50 and output the feedback signal 33 having a feedback frequency comprising a fraction of the oscillating signal frequency 50.

The PLL 10 may also include a lock detector 26 configured to output a lock signal 56 based on a phase of the reference signal 32 and a phase of the feedback signal 33. For example, when a phase difference between the phase of the oscillator signal 50 (i.e., the feedback signal 33) and the phase of the reference signal 32 is less than a lock threshold, the lock signal 56 may indicate that lock has been achieved. Similarly, when the phase difference is greater than the lock threshold, the lock signal 56 may indicate that lock has not been achieved. The lock signal 56 may vary with time based on this phase difference.

The control circuit 20 may receive the lock signal 56 and use the lock signal 56 to determine the elevator voltage 46. That is, the control circuit 20 may be configured to determine the elevator voltage 46 based on the control input signal 44, the tuning acceptance range of the oscillator, and the lock signal 56. For example, when the lock signal 56 indicates that lock has not been achieved, an amplitude of the elevator signal 46 may be adjusted by the control circuit 20 such that an amplitude of the oscillator tuning signal 48 is maintained in relation to a particular extreme of the tuning acceptance range of the oscillator. The particular extreme of the tuning acceptance range may include a minimum or a maximum of the tuning acceptance range and the particular extreme of the tuning acceptance range may be chosen based on an amplitude of the control input signal 44. A difference may be maintained between the oscillator tuning signal and the particular extreme. This difference may have a magnitude not greater than the reduced tuning range (i.e., the range of the reduced tuning signal 42).

When the lock signal 56 indicates that lock has been achieved, an amplitude of the elevator signal 46 may be continuously adjusted to maintain the control input signal 44 relative to a midpoint of the control input signal 44. For example, the control input signal 44 may be maintained between 10% and 90% of its range.

Turning to FIG. 2, the oscillator tuning signal 48 is shown with respect to the reduced tuning range, the lock signal 56, and the elevator signal 46. As shown, the reduced tuning range is only a portion of the tuning acceptance range. When lock is achieved (represented by the "unlocked"/"locked" dividing line in the figure), the elevator signal 46 is increased so that the oscillator tuning voltage 48 accesses a larger portion of the tuning acceptance range.

Turning to FIG. 3, the oscillator tuning signal of a standard PLL is shown along with a lock signal and the oscillator tuning acceptance range. Comparing FIGS. 2 and 3, transients in the oscillator tuning signal 48, and as a consequence transients in the frequency of the oscillator signal 50, in a standard PLL have a higher amplitude in FIG. 3 (a standard PLL) than in FIG. 2 (the PLL 10 described herein having reduced frequency transients).

The control input signal 44 and oscillator tuning signal 48 may both be analog signals. For this reason, the control circuit may include an analog-to-digital converter (ADC) and a digital-to-analog converter (DAC). The ADC is configured to convert the control input signal 44 to a digital signal, while the DAC is configured to convert the elevator signal 46 to an analog signal. Such a configuration may include digital processing such as can be performed by a microprocessor to calculate the elevator signal. This allows for adaptation of the processing to determine pre-positioning of the elevator signal prior to lock, limitation of elevator slew rate and the adjustment of the elevator signal after lock, to the requirements of a particular application. Typically the adjustment of the elevator signal after lock may be accomplished by applying changes proportional to a difference between the filter output signal and the mid-point of the filter output range.

Turning to FIG. 4, a radar system 70 is shown where radar signals are derived at least in part from the oscillating signal of any embodiment of the PLL 10 described herein.

The "signals" described herein may be voltages that vary with time.

All ranges and ratio limits disclosed in the specification and claims may be combined in any manner. Unless specifically stated otherwise, references to "a," "an," and/or "the" may include one or more than one, and that reference to an item in the singular may also include the item in the plural.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A phased locked loop (PLL) having reduced frequency transients, the PLL comprising:
    a phase-frequency detector (PFD) configured to output a PFD signal based on two inputs, wherein the two inputs including a reference signal and a feedback signal;
    a charge pump configured to receive the PFD signal and output a charge signal;
    a filter configured to receive the charge signal and output a filter output signal;
    an oscillator configured to receive an oscillator tuning signal within a tuning acceptance range and output an oscillating signal;
    a reducer circuit configured to receive the filter output signal and output a reduced tuning signal; and
    a control circuit configured to:
        receive a control input signal based on the reduced tuning signal;
        determine an elevator signal based on the control input signal and the tuning acceptance range of the oscillator; and
        output the elevator signal;
    wherein the oscillator tuning signal is based on a combination of:
        the reduced tuning signal; and
        the elevator signal;
    wherein the oscillating signal has a frequency and a phase based at least in part on the oscillator tuning signal; and
    wherein the feedback signal received by the PFD is based on the oscillating signal.

2. The PLL of claim 1, wherein the control input signal is the reduced tuning signal.

3. The PLL of claim 1, further comprising a frequency divider configured to receive the oscillating signal and output the feedback signal having a feedback frequency comprising a fraction of the oscillating signal frequency.

4. The PLL of claim 1, wherein the oscillator tuning signal is the sum of the reduced tuning signal and the elevator signal.

5. The PLL of claim 1, wherein the oscillator tuning signal has a range comprised of a substantial portion of the tuning acceptance range.

6. The PLL of claim 5, wherein the oscillator tuning signal has a range comprised of at least 90% of the tuning acceptance range.

7. The PLL of claim 1, wherein:
    the elevator signal has an elevator slew rate comprising a time derivate of the elevator signal; and
    the elevator slew rate is limited by the control circuitry to be less than a maximum slew rate calculated from properties of the charge pump and the filter.

8. The PLL of claim 7, wherein the elevator slew rate is less than 10% of the maximum slew rate.

9. The PLL of claim 1, wherein the reduced tuning signal has a reduced tuning range comprised of only a portion of the tuning acceptance range of the oscillator.

10. The PLL of claim 9, wherein the reducer circuit is adjustable such that the reduced tuning range comprises a selectable portion of the acceptance range.

11. The PLL of claim 9, wherein the reduced tuning range is less than 30% of the tuning acceptance range.

12. The PLL of claim 1, further comprising a lock detector configured to output a lock signal based on a phase of the reference signal and a phase of the feedback signal, wherein:
    when a phase difference between the phase of the oscillator signal and the phase of the reference signal is less than a lock threshold, the lock signal indicates that lock has been achieved; and
    when the phase difference is greater than the lock threshold, the lock signal indicates that lock has not been achieved.

13. The PLL of claim 12, wherein:
    the control circuit is configured to additionally receive the lock signal; and
    the elevator voltage is determined based on the control input signal, the tuning acceptance range of the oscillator, and the lock signal.

14. The PLL of claim 13, wherein:
    when the lock signal indicates that lock has not been achieved, an amplitude of the elevator voltage is adjusted by the control circuit such that an amplitude of the oscillator tuning signal is maintained in relation to a particular extreme of the tuning acceptance range of the oscillator; and
    the particular extreme of the tuning acceptance range comprises a minimum or a maximum of the tuning acceptance range and the particular extreme of the tuning acceptance range is chosen based on an amplitude of the control input signal.

15. The PLL of claim 14, wherein a difference, maintained between the oscillator tuning signal and the particular extreme, has a magnitude not greater than the reduced tuning range.

16. The PLL of claim 12, wherein:
when the lock signal indicates that lock has been achieved, an amplitude of the elevator signal is continuously adjusted to maintain the control input signal relative to a midpoint of the control input signal.

17. The PLL of claim 16, wherein the control input signal is maintained between 10% and 90% of its range.

18. The PLL of claim 1, wherein:
the control input signal and oscillator tuning signal are both comprised of analog signals;
the control circuit includes:
an analog-to-digital converter (ADC) configured to convert the control input signal to a digital signal; and
a digital-to-analog converter (DAC) configured to convert the elevator signal to an analog signal.

19. The PLL of claim 1 wherein the oscillator includes a sapphire-loaded cavity resonator.

20. A radar system wherein radar signals are derived at least in part from the oscillating signal of claim 1.

* * * * *